United States Patent
Hirashima et al.

(10) Patent No.: US 9,877,391 B2
(45) Date of Patent: Jan. 23, 2018

(54) ELECTRONIC MODULE COMPRISING FLEXIBLE CONDUCTING MEMBER CONNECTED THERETO AND METHOD OF CONNECTING FLEXIBLE CONDUCTING MEMBER TO ELECTRONIC MODULE

(71) Applicant: KABUSHIKI KAISHA TOSHIBA, Tokyo (JP)

(72) Inventors: Masaya Hirashima, Ome Tokyo (JP); Takahiro Sakaguchi, Ome Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 38 days.

(21) Appl. No.: 15/052,813

(22) Filed: Feb. 24, 2016

(65) Prior Publication Data
US 2017/0099734 A1   Apr. 6, 2017

Related U.S. Application Data

(60) Provisional application No. 62/237,495, filed on Oct. 5, 2015.

(51) Int. Cl.
| H05K 1/14 | (2006.01) |
| H05K 1/11 | (2006.01) |
| H05K 1/02 | (2006.01) |
| H05K 13/00 | (2006.01) |

(52) U.S. Cl.
CPC ............. *H05K 1/14* (2013.01); *H05K 1/028* (2013.01); *H05K 1/111* (2013.01); *H05K 13/0023* (2013.01); *H05K 2201/04* (2013.01)

(58) Field of Classification Search
CPC .......... H05K 1/14; H05K 1/111; H05K 1/028; H05K 1/0281; H05K 13/0023; H05K 3/363; H05K 3/365
See application file for complete search history.

(56) References Cited

U.S. PATENT DOCUMENTS

| 5,691,509 A * | 11/1997 | Balzano ................. H01R 12/62 |
| | | 174/117 F |
| 6,020,559 A * | 2/2000 | Maeda ................. H01B 7/0838 |
| | | 174/117 F |
| 7,660,129 B2 | 2/2010 | Minota et al. |
| 2002/0074157 A1 * | 6/2002 | Kato ..................... H01R 12/62 |
| | | 174/250 |

(Continued)

FOREIGN PATENT DOCUMENTS

| JP | 2008-205132 | 9/2008 |
| JP | 2013-197040 | 9/2013 |
| JP | 2013-197041 | 9/2013 |

*Primary Examiner* — Hoa C Nguyen
*Assistant Examiner* — Christopher L Augustin
(74) *Attorney, Agent, or Firm* — Rutan & Tucker, LLP

(57) ABSTRACT

According to one embodiment, a electronic module includes a circuit board including an electronic component mounted thereon, a flexible conducting member including a conductor including a portion covered with a covering member and a portion exposed from an edge of the covering member and soldered to the circuit board, and an engagement member engaging with the flexible conducting member to place the engaged flexible conducting member in a predetermined position on the circuit board and is attached to the circuit board by an attachment method the same as a method of mounting the electronic component on the circuit board.

10 Claims, 12 Drawing Sheets

(56) References Cited

U.S. PATENT DOCUMENTS

2004/0074670 A1\* 4/2004 Kitagawa ............... H01R 12/62
 174/262
2008/0198566 A1 8/2008 Minota et al.
2010/0187005 A1\* 7/2010 Yeh ........................ H01R 12/62
 174/268
2013/0192887 A1\* 8/2013 Yaguchi ............... H01B 7/0823
 174/262

\* cited by examiner

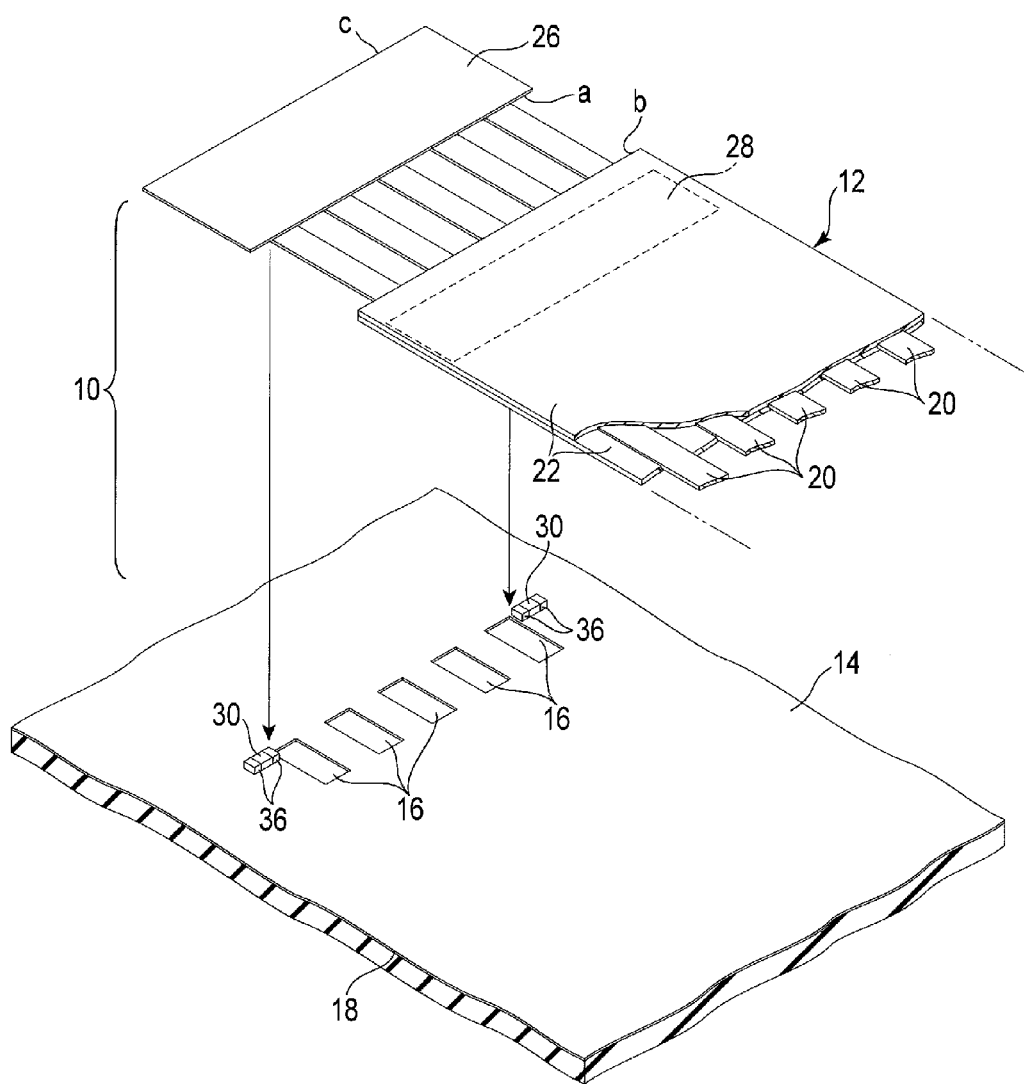
F I G. 7

ELECTRONIC MODULE COMPRISING FLEXIBLE CONDUCTING MEMBER CONNECTED THERETO AND METHOD OF CONNECTING FLEXIBLE CONDUCTING MEMBER TO ELECTRONIC MODULE

CROSS-REFERENCE TO RELATED APPLICATIONS

This application claims the benefit of U.S. Provisional Application No. 62/237,495, filed Oct. 5, 2015, the entire contents of which are incorporated herein by reference.

FIELD

Embodiments described herein relate generally to an electronic module comprising a flexible conducting member connected thereto with solder and a method of connecting the flexible conducting member to the electronic module.

BACKGROUND

In electronic devices, flexible flat cables (FFCs) are used for connecting one electronic module to another. Recently, a technique of exposing the conductors of an FFC from a covering member and directly attaching the conductors to pads on a circuit board with solder has been known.

However, in soldering the FFC directly to the circuit board, great work is required to align the FFC with the pads.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 7 is an exploded view of a part of the electronic module of the first embodiment.

DETAILED DESCRIPTION

Various embodiments will be described hereinafter with reference to the accompanying drawings.

In general, according to one embodiment, an electronic module is connected, for example, to another electronic module by an FFC and attached to the inside of an electronic device.

(First Embodiment)

Figure 1:
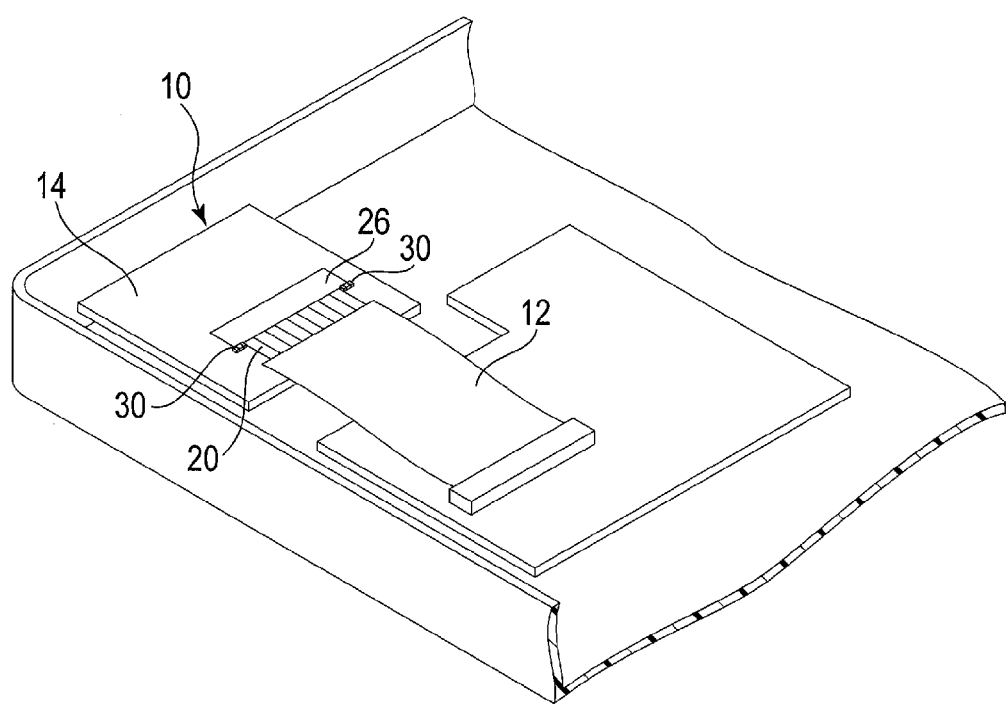
FIG. 1 is a perspective view of a part of an electronic device comprising an electronic module of an embodiment.
Figure 2:
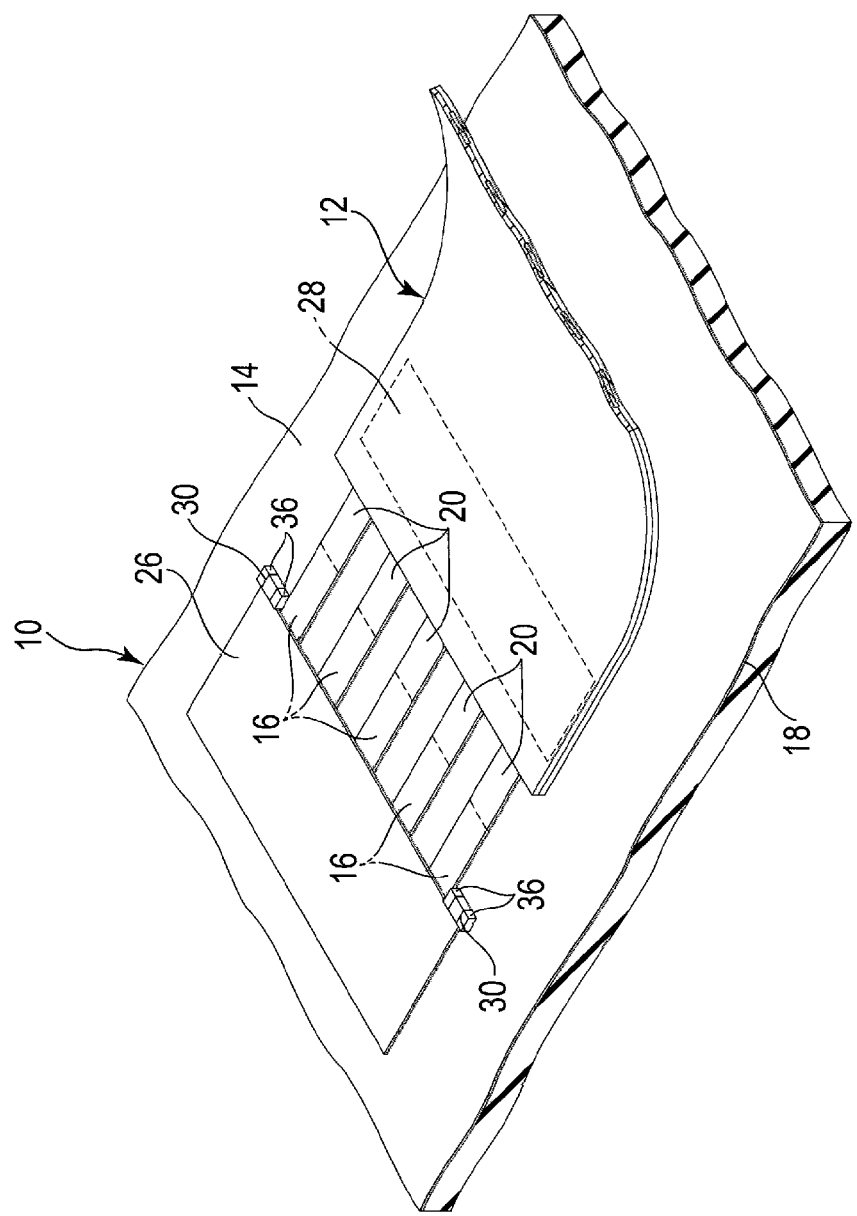
FIG. 2 is a perspective diagram showing a part of an electronic module of the first embodiment.

FIGS. 1 and 2 are perspective views of an electronic module 10 of the first embodiment. The electronic module 10 comprises a circuit board 14, electronic components constituting a circuit and a flexible flat cable 12. The electronic module 10 is incorporated in an electronic device and connected to, for example, another electronic module by the flexible flat cable 12 as shown in FIG. 1. The electronic device in which the electronic module 10 is incorporated includes, for example, a personal computer.

Figure 3:
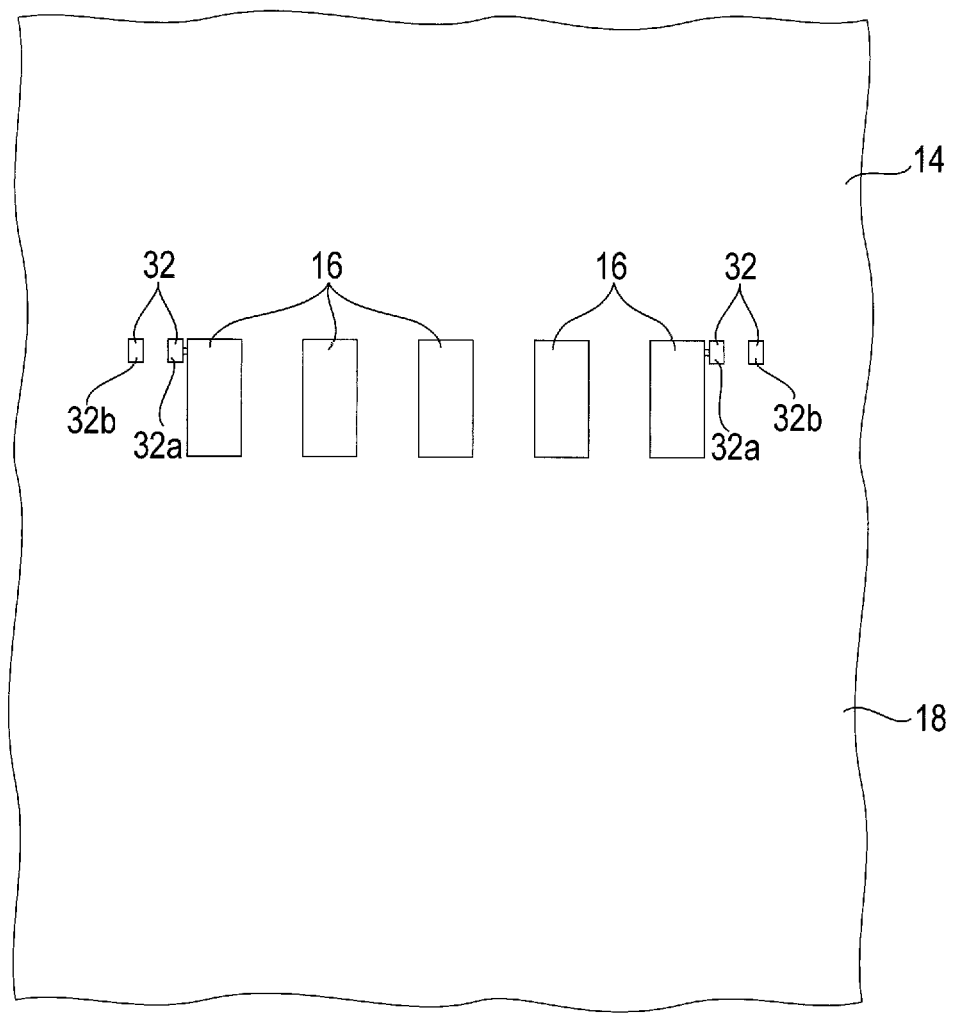
FIG. 3 is a plan view of a part of a circuit board of the first embodiment.

The circuit board 14 is a basically inflexible and rigid substrate and comprises predetermined conducting traces provided by printing or the like thereon. To the upper surfaces of the traces, a solder resist 18 is applied. The circuit board 14 comprises cable pads 16 to which the flexible flat cable 12 is connected as shown in FIG. 3.

The cable pads 16 correspond to conductors 20 of the flexible flat cable 12, which will be described later. That is, the cable pads 16 have a total width substantially the same as that of the flexible flat cable 12 and are provided at the same equal intervals as those of the conductors 20. Note that it is possible to raise the portions between the cable pads 16 by performing printing and forming printing products.

Further, the circuit board 14 comprises a capacitor pad 32. The capacitor pad 32 is a pad to which a ceramic capacitor 30 as an engagement member is attached. Two pairs of the capacitor pads 32, each provided symmetrically, are provided at both ends of the cable pads 16 as shown in FIG. 3.

The pair of the capacitor pads 32 corresponds to two connecting terminals 36 of the ceramic capacitor 30 and is formed in such a manner as to face each other. The line connecting the pair of the capacitor pad 32 extends along the arrangement line of the cable pads 16. Further, one of the pair of the capacitor pads 32, namely, a pad 32a is connected to either end of the cable pad 16, while the other of the pair of the capacitor pads 32, namely, a pad 32b is connected to the ground of the circuit board 14.

Figure 6:
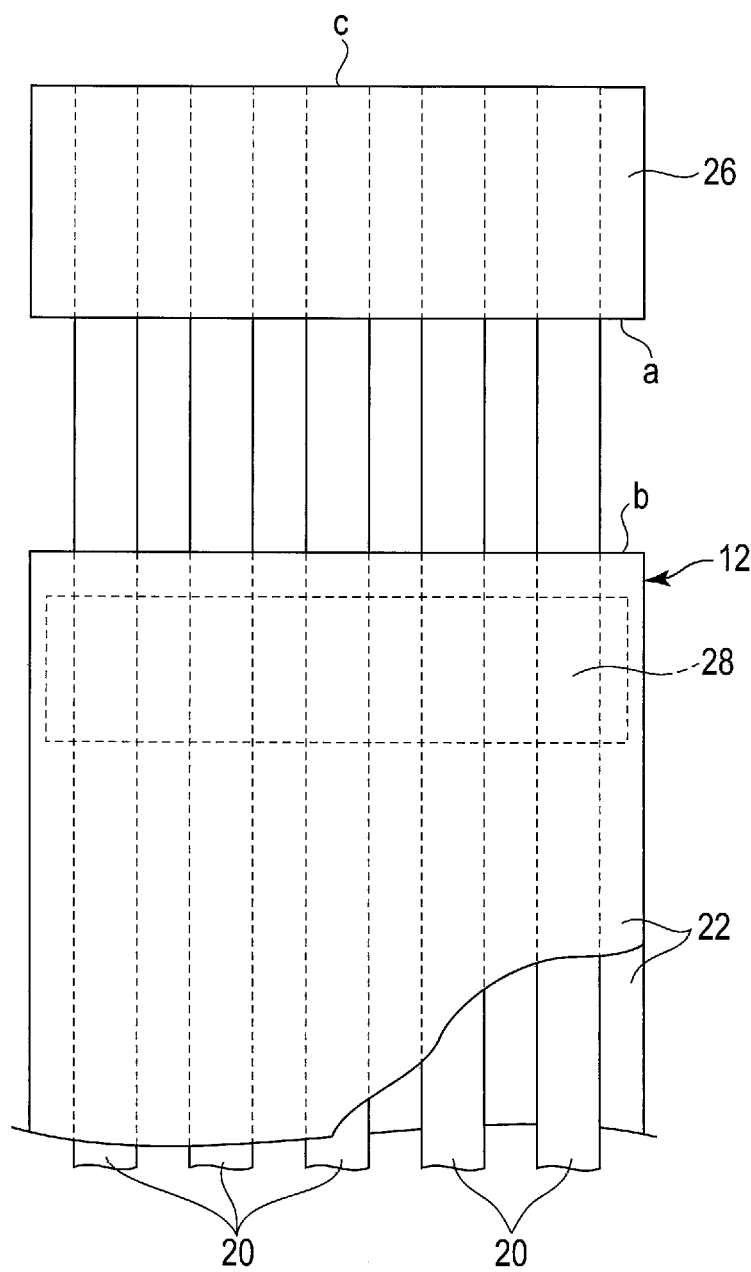
FIG. 6 is a plan view of a part of a flexible flat cable of the first embodiment.

FIG. 6 shows the flexible flat cable 12. The flexible flat cable 12 is a flexible multicore conducting member comprising the conductors 20. Each of the conductors 20 is a thin, plate-like conductor and consists of copper, an alloy thereof or the like. The conductors 20 are provided at equal intervals along the longitudinal flexible flat cable 12 parallel to each other.

The conductors 20 are covered with an insulating covering member 22. The conductors 20 are exposed to the outside from an edge b of the covering member 22. The conductors 20 extend outward from edge b in a manner basically the same as that of the conductors 20 covered with the covering member 22.

At the front ends of the conductors 20, a conductor holding film 26, which functions as a member which holds the conductors, is provided. The conductor holding film 26 is, for example, a synthetic resin, thin plate-like rectangular member and has predetermined strength. The conductor holding film 26 is provided at a predetermined distance away from edge b of the covering member 22 of the flexible flat cable 12 in such a manner that an edge a of the conductor holding film 26 is parallel to edge b of the covering member 22 of the flexible flat cable 12.

Edge a of the conductor holding film 26 on the side of the flexible flat cable 12 is basically perpendicular to the longitudinal conductors 20. Between edge a of the conductor holding film 26 and edge b of the flexible flat cable 12, the conductors 20 of the flexible flat cable 12 are exposed.

In the vicinity of edge b of the flexible flat cable 12, an adhesive member 28 is provided. The adhesive member 28 is provided on the surface of the flexible flat cable 12 on the circuit board 14 side. The adhesive member 28 is a tape-shaped member having both surfaces applied with an adhesive agent such as a double-sided adhesive tape and is attached to the covering member 22. When attaching the flexible flat cable 12 to the circuit board 14 with the adhesive member 28, the adhesive member 28 has sufficient adhesion strength to fix the flexible flat cable 12 to the circuit board 14.

Figure 4:
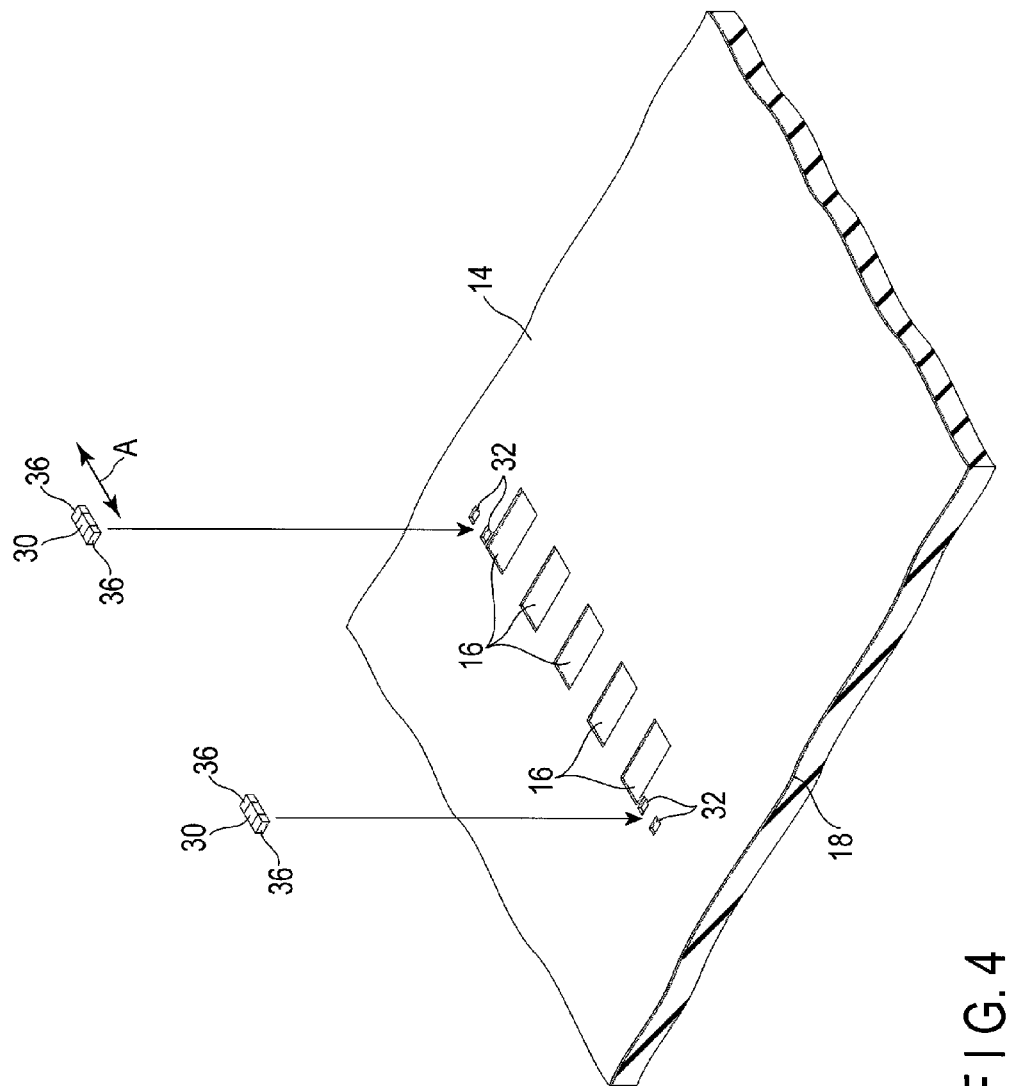
FIG. 4 is a perspective view of a part of the circuit board of the first embodiment.

The ceramic capacitor 30 is substantially a rectangular parallelepiped, the longitudinal line of which is indicated by arrow A as shown in FIG. 4. The ceramic capacitor 30 has a substantially square section when taken along a line perpendicular to the longitudinal line. The ceramic capacitor 30 comprises connecting terminals 36 at both ends along the longitudinal line. The connecting terminal 36 is formed of a metal thin film and is connected to an internal electrode of the ceramic capacitor 30. Note that the above-described shape of the ceramic capacitor 30 is in no way restrictive.

The ceramic capacitor 30 is attached to the pads formed on the circuit board 14 in a process of mounting electronic components other than the ceramic capacitor 30 on the circuit board 14. When the ceramic capacitor 30 is mounted on the circuit board 14 in accordance with the capacitor pads 32, the ceramic capacitor 30 functions as an engagement member which engages with edge a of the conductor holding film 26 of the flexible flat cable 12.

Further, the ceramic capacitor 30 attached to the capacitor pads 32 is mounted on the circuit board 14 in such a manner that the conductors 20 of the flexible cable 12, when the flexible flat cable 12 is engaged with the ceramic capacitor 30, correspond to the respective cable pads 16 of the circuit board 14.

Next, the function and effect of the electronic module 10 will be described. The circuit board 14 comprises traces made of copper foil or the like. To the traces of the circuit board 14, the solder resist 18 is applied. The circuit board 14 comprises the same number of cable pads 16 as that of the conductors 20 of the flexible flat cable 12. At both ends of the cable pads 16, the capacitor pads 32 are provided in pairs.

Various electronic components are mounted on the circuit board 14 with solder. These electronic components are essential to the circuit structure of the electronic module 10. In the process of mounting these electronic components on the circuit board 14, the ceramic capacitor 30 is also soldered to the capacitor pads 32. Note that the ceramic capacitor 30 is not necessarily an electronic component essential to the circuit structure of the electronic module 10. That is, the ceramic capacitor 30 may be attached to the circuit board 14 simply as an engagement member.

Figure 5:
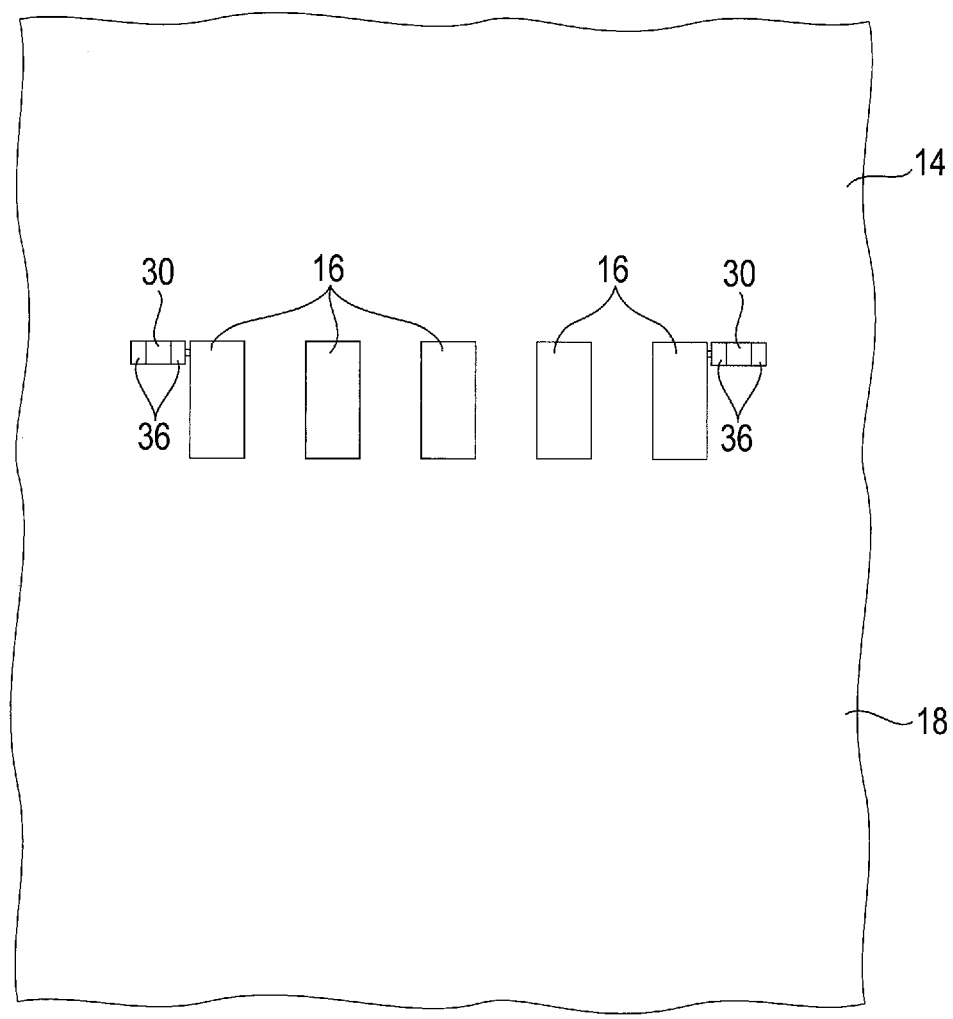
FIG. 5 is a plan view of a part of the electronic module of the first embodiment.

FIG. 5 shows a state where the ceramic capacitors 30 are attached to the circuit board 14. The longitudinal ceramic capacitors 30 are attached on both ends of the cable pads 16 along the arrangement line of the cable pads 16. The ceramic capacitors 30 are soldered to the capacitor pads 32 and thereby attached to predetermined positions on the circuit board 14. The circuit board, which electronic components other than the ceramic capacitor 30 are attached to, constitutes the electronic module 10.

Then, the flexible flat cable 12 is further attached to the electronic module 10 comprising the ceramic capacitors 30. The flexible flat cable 12 is prepared in the above-described form together with the conductor holding film 26 in advance. The flexible flat cable 12 is placed in such a manner as shown in FIG. 7 that all the conductors 20 are placed between the pair of the ceramic capacitors 30 and that edge a of the conductor holding film 26 is engaged with the side surfaces of the ceramic capacitors 30.

Figure 8:
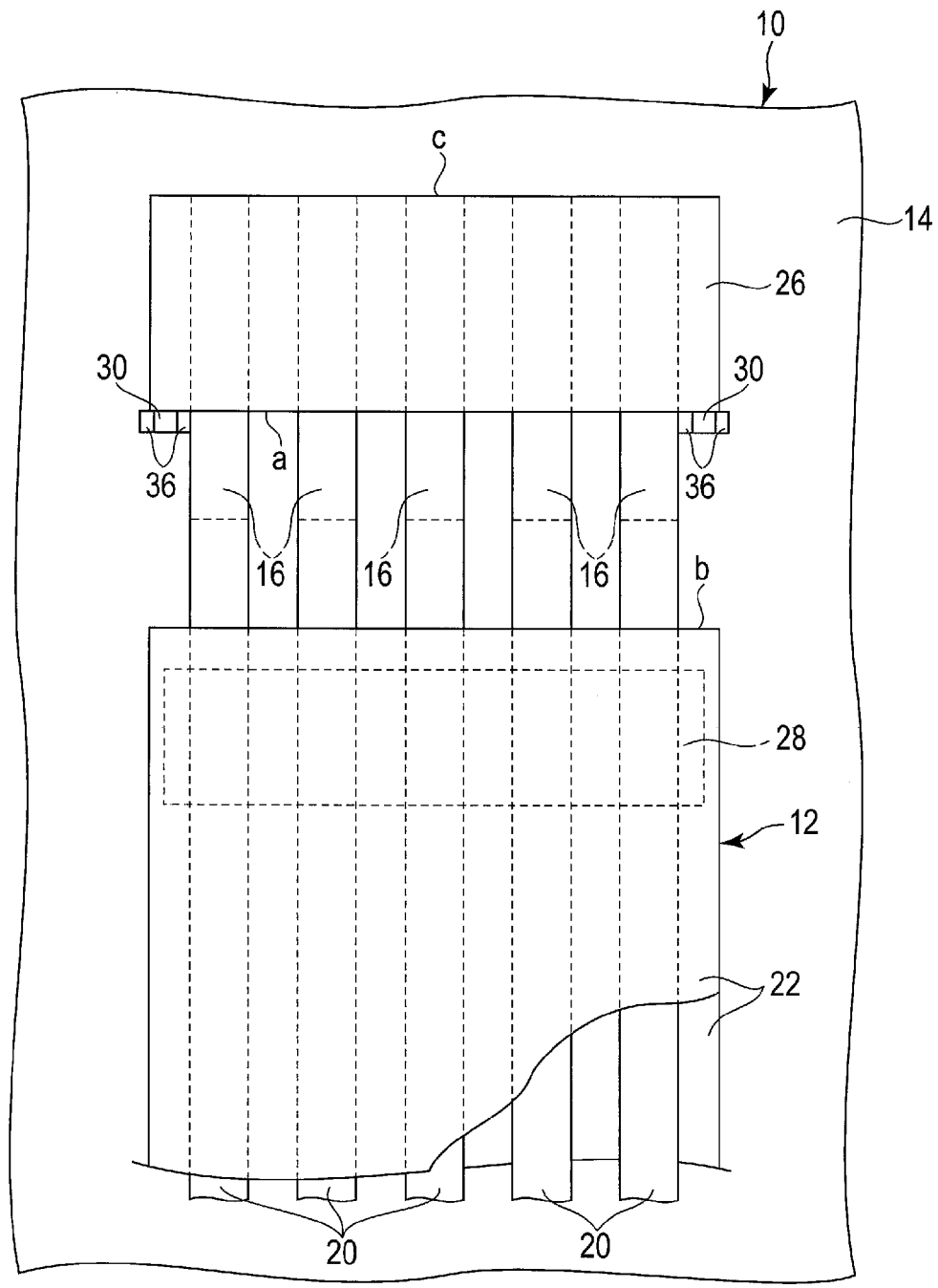
FIG. 8 is a plan view of a part of the electronic module of the first embodiment.

In this way, the flexible flat cable 12 is provided in a predetermined position of the electronic module 10 as shown in FIG. 8. When the flexible flat cable 12 is provided in a predetermined position of the electronic module 10, the conductors 20 are provided precisely on the corresponding cable pads 16, respectively. Further, the adhesive member 28 is attached to the electronic module 10, and the portion near edge b of the flexible flat cable 12 is fixed to the electronic module 10.

Then, the conductors 20 are soldered to the respective cable pads 16. In soldering the conductors 20, for example, a heated bar-like member is pressed on the conductors 20 so that the cream solder applied between the conductors 20 and the cable pads 16 in advance melts, and then the molten solder is cooled and solidified. This state is shown in FIG. 2.

According to the present embodiment, the position of the flexible flat cable 12 on the electronic module 10 is determined by engaging the conductor holding film 26 provided at the front end of the flexible flat cable 12 with the ceramic capacitors 30. In this way, the conductors 20 of the flexible flat cable 12 can be easily and precisely provided on the respective cable pads 16.

The ceramic capacitor 30 can be attached to the circuit board 14 in the process of mounting the other electronic components which are to be mounted on the circuit board 14. Therefore, there is no need to add any other process to the conventional processes or increase work to realize the position determination of the flexible flat cable 12.

Since one electrode contacts the conductor 20 of the flexible flat cable 12 and the other electrode contacts the ground of the electronic module 10, the ceramic condenser 30 has an effect substantially the same as that of a bypass capacitor on the conductor 20 and thus achieves noise reduction or the like. Note that the electronic component used as the engagement member of the present embodiment is not necessarily limited to the ceramic capacitor 30.

(Second Embodiment)

Figure 9:
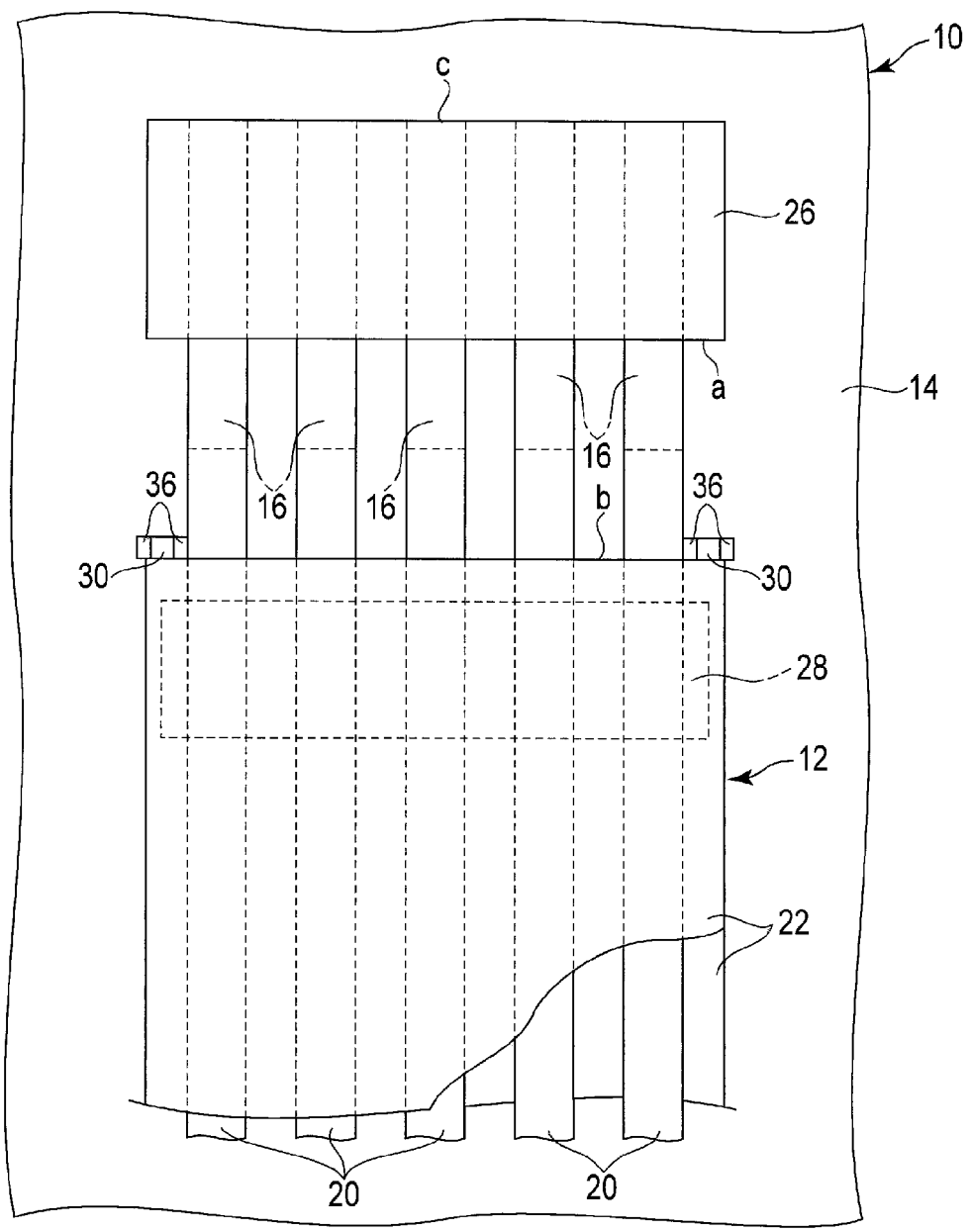
FIG. 9 is a plan view of a part of an electronic module of the second embodiment.

In the present embodiment, as shown in FIG. 9, the attachment positions of the ceramic capacitors 30 are changed from those of the first embodiment so that the ceramic capacitors 30 engage with edge b of the covering member 22 of the flexible flat cable 12. By using the ceramic capacitors 30 of the present embodiment, the position of the flexible flat cable 12 on the electronic module 10 is determined. Then, the conductors 20 of the flexible flat cable 12 are soldered to the cable pads 16.

According to the second embodiment, the position of the flexible flat cable 12 on the electronic module 10 is determined easily and precisely in a manner similar to that of the first embodiment. Further, since the conductor holding film 26 is not used for the position determination of the flexible flat cable 12 in the present embodiment, it is possible to make the structure simpler. Still further, when the conductor 20 has sufficient strength to keep its shape even in the state of being exposed from edge b of the covering member 22, the conductor holding film 26 may not be used for the flexible flat cable 12.

Still further, the position engaged with the engagement member is not necessarily restricted to the edge of the covering member 22 of the flexible flat cable 12 but may be other portion. It is also possible to determine the position of the flexible flat cable 12 by attaching a thin, flake-like member to the covering member 22 of the flexible flat cable 12 and engaging the attached flake-like member with the engagement member.

(Third Embodiment)

Figure 10:
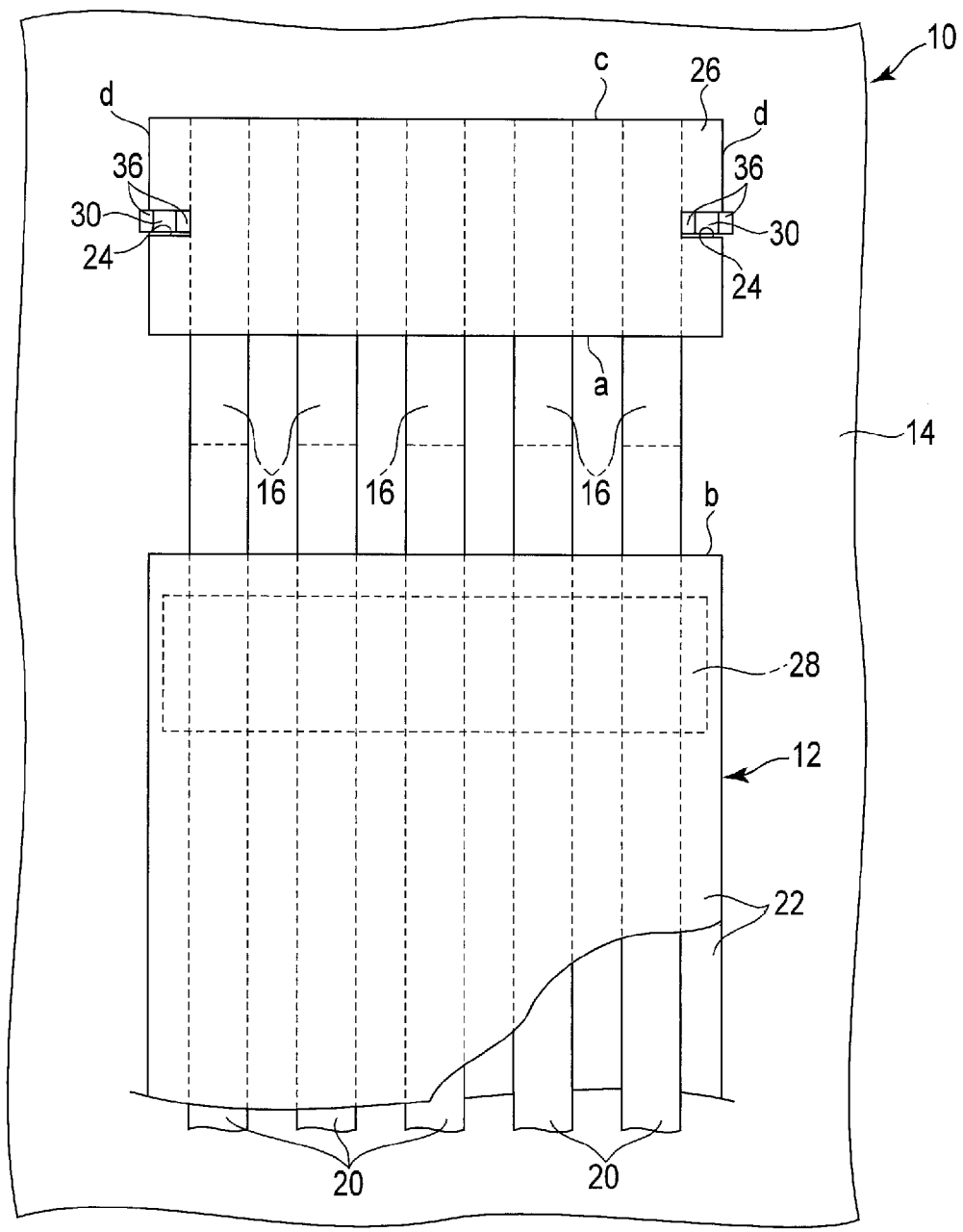
FIG. 10 is a plan view of a part of an electronic module of the third embodiment.

In the present embodiment, as shown in FIG. 10, notches 24 are provided in the conductor holding film 26 and are engaged with the ceramic capacitors 30. The notches 24 are provided on both edges d of the lateral conductor holding film 26 as shown in FIG. 10. Further, the notches 24 are formed in such a manner as to conform to the widths of the ceramic capacitors 30 and to reach the conductors 20 at both ends of the flexible flat cable 12.

According to the third embodiment, the position of the flexible flat cable 12 on the electronic module 10 is determined easily and precisely. Further, since the ceramic capacitors 30 engaging with the notches 24 contact the conductors 20, the ceramic capacitors 30 can function as bypass capacitors of the conductors 20 contacting the ceramic capacitors 30.

(Fourth Embodiment)

Figure 11:
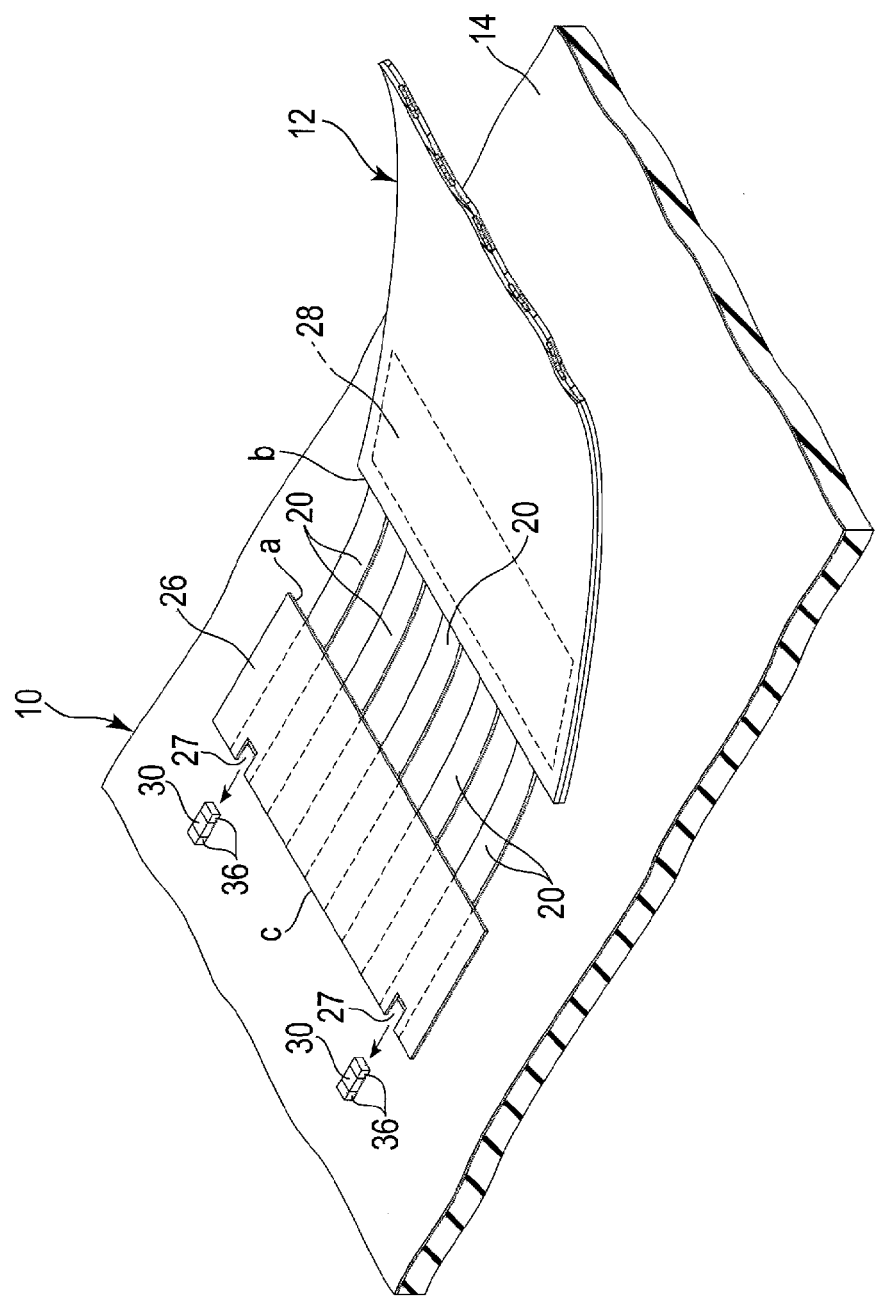
FIG. 11 is a perspective view of a part of an electronic module of the fourth embodiment.

In the present embodiment, as shown in FIG. 11, notches 27 are provided at a front edge c of the conductor holding film 26 and are engaged with the ceramic capacitors 30 attached to the electronic module 10 in accordance with the notches 27. The notches 27 are formed in accordance with the conductors 20 of the flexible flat cable 12 located in given positions.

According to the fourth embodiment, it is possible to determine the position of the flexible flat cable 12 on the electronic module 10 and have an effect of a bypass capacitor on a desired conductor 20 by the ceramic capacitor 30.

Note that the connecting terminal 36 of the ceramic capacitor 30 and the conductor 20 may not contact each other in any of the above-described embodiments.

(Fifth Embodiment)

Figure 12:
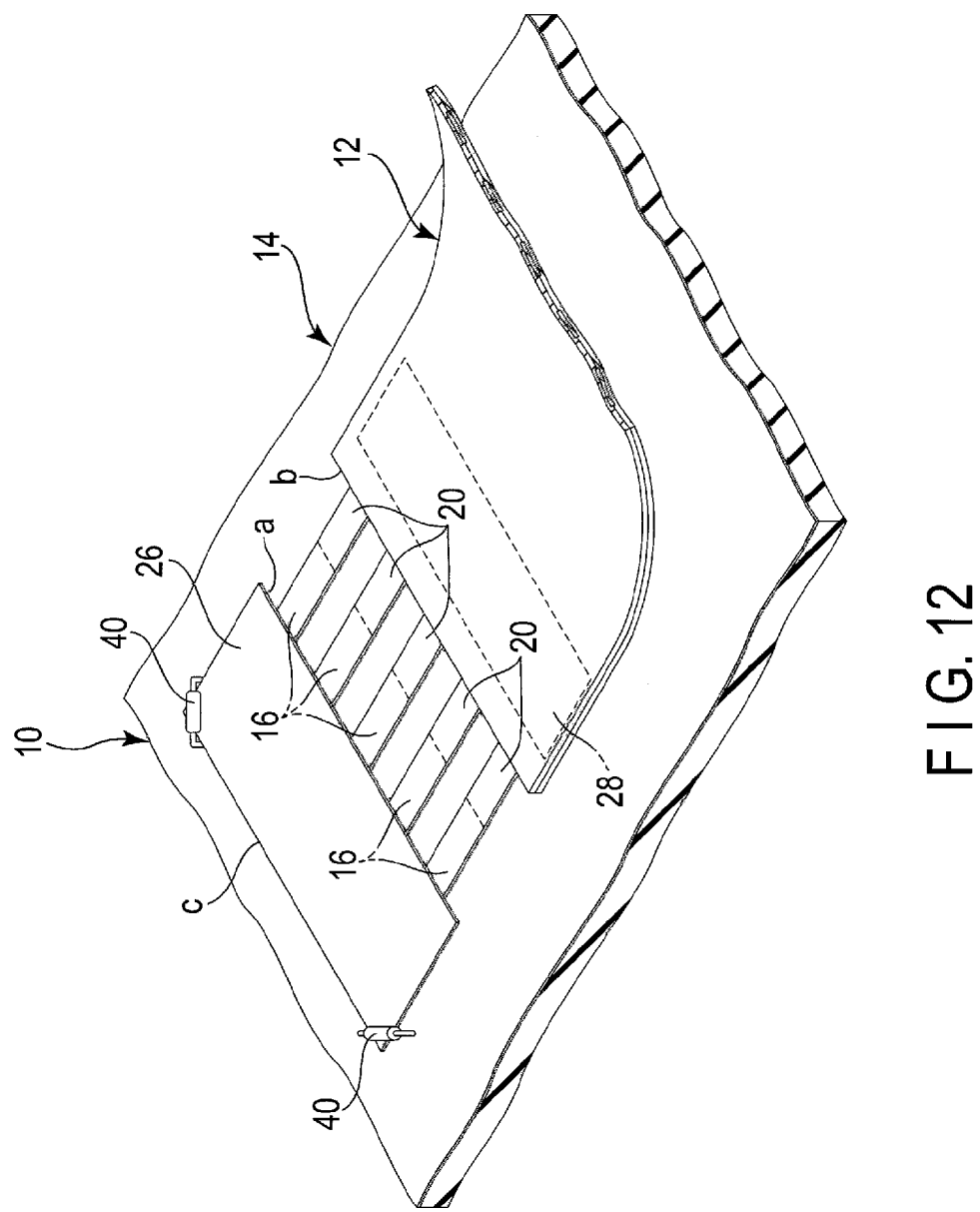
FIG. 12 is a plan view of a part of an electronic module of the fifth embodiment.

In the present embodiment, as shown in FIG. 12, a resistor 40 is used as an engagement member in place of the ceramic capacitor 30. The resistor 40 is a resistor comprising lead lines at both ends. The resistors 40 are attached to the circuit board 14 in such a manner that both corners of front edge c of the conductor holding film 26 are tucked thereinto. Then, the corners of the conductor holding film 26 are inserted into the lead lines of the respective resistors 40, and the position of the flexible flat cable 12 on the electronic module 10 is thereby determined. Also in the present embodiment, the position of the flexible flat cable 12 on the electronic module 10 can be determined easily and precisely.

Note that, in the present embodiment, any other electronic component may be used instead of the resistor 40 as long as the electronic component comprises lead lines at both ends. Further, since the lead lines of the resistor 40 or the like do not contact the conductors 20 of the flexible flat cable 12, and the resistor 40 does not cause a problem in the circuit. Still further, it is also possible to fit the resistor 40 or the like in notches by forming notches in the conductor holding film 26 in such a manner that the lead lines of the resistor 40 fit therein. Still further, it is also possible to engage the resistor 40 or the like with the covering member 22 of the flexible flat cable 12.

Still further, it is also possible to form not a notch but a hole in the conductor holding film 26 for an engagement member to fit in, and determine the position of the flexible flat cable 12 on the electronic module 10 by fitting the engagement member in the hole. Still further, the conductor holding film 26 does not necessarily have a rectangular shape but may have other shape. The engagement member engaging with the conductor holding film 26 is not necessarily restricted to an electronic component but may be other member. Still further, in the case of using an electronic component such as the ceramic capacitor 30 as an engagement member, the electronic component is not necessarily soldered to the circuit board 14 in such a manner as to function as an electronic component. For example, in the case of attaching the ceramic capacitor 30 to the circuit board 14, either one of the connecting terminals at both ends of the ceramic capacitor 30 may be attached to a single pad or both of the connecting terminals of the ceramic capacitor 30 may be attached to a single pad.

Still further, in any of the above-described embodiments, the other end of the flexible flat cable 12 of the above-described embodiment may be connected to another electronic module or the like by adopting any one of the above-described embodiments or adopting a conventional method using a connector or the like.

Still further, although the above description has been based on the assumption that the flexible conducting member of the embodiments is a flexible flat cable, the flexible conducting member of the embodiments is not necessarily restricted to a flexible flat cable but may be a flexible electronic module comprising a flexible circuit board.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic module comprising:
   a circuit board comprising an electronic component mounted thereon; and
   a flexible conducting member comprising a conductor comprising a portion covered with a covering member and a portion exposed from an edge of the covering member and soldered to the circuit board;
   a capacitor engaging with the flexible conducting member to place the flexible conducting member in a predetermined position on the circuit board and attached to the circuit board by an attachment method the same as a method of mounting the electronic component on the circuit board.

2. The electronic module of claim 1, wherein
   the flexible conducting member comprises the conductor comprising a portion exposed from the edge of the covering member,
   the exposed portion of the conductor is provided with a conductor holding member at a predetermined distance away from the edge of the covering member, and
   the capacitor engages with the conductor holding member.

3. The electronic module of claim 2, wherein
   the conductor holding member comprises a notch, and
   the capacitor engages with the notch.

4. The electronic module of claim 1, wherein
the capacitor engages with the edge of the covering member of the flexible conducting member.

5. The electronic module of claim 1, wherein
the flexible conducting member comprises a to-be-engaged member in the covering member, and
the capacitor engages with the to-be-engaged member provided in the covering member.

6. The electronic module of claim 1, wherein
the capacitor comprises one electrode contacting the conductor and the other electrode is grounded.

7. The electronic module of claim 1, wherein
the flexible conducting member comprises a flexible flat cable including a plurality of the conductors in the covering member parallel to one another.

8. The electronic module of claim 7, wherein
the electronic module further comprises an adhesive member by which a portion near the edge of the covering member of the flexible flat cable is attached to the circuit board.

9. The electronic module of claim 1, wherein
the flexible conducting member comprises a flexible electronic module including a flexible circuit board that comprises conducting traces thereon, and the electronic module further comprises an adhesive member by which a portion near an edge portion of the flexible circuit board of the flexible electronic module is attached to the circuit board.

10. A method of connecting a flexible conducting member to an electronic module comprising:
attaching a capacitor to a circuit board comprising a flexible conducting member in a portion to place the flexible conducting member in a predetermined position on the circuit board when engaging the flexible conducting member with the capacitor by an attachment method the same as a method of mounting an electronic component on the circuit board; and
engaging the flexible conducting member with the capacitor and soldering a conductor of the flexible conducting member to a pad on the circuit board.

\* \* \* \* \*